United States Patent
Ha et al.

(10) Patent No.: US 8,786,740 B2
(45) Date of Patent: Jul. 22, 2014

(54) IMAGING DEVICE, ELECTRIC CHARGE READOUT METHOD, AND IMAGING APPARATUS

(75) Inventors: Sanghoon Ha, Kanagawa (JP); Hiroaki Ishiwata, Tokyo (JP)

(73) Assignee: Sony Corporation (JP)

( * ) Notice: Subject to any disclaimer, the term of this patent is extended or adjusted under 35 U.S.C. 154(b) by 533 days.

(21) Appl. No.: 12/794,351

(22) Filed: Jun. 4, 2010

(65) Prior Publication Data

US 2010/0321616 A1  Dec. 23, 2010

(30) Foreign Application Priority Data

Jun. 22, 2009  (JP) .................................. 2009-147511

(51) Int. Cl.
*H04N 3/14* (2006.01)
(52) U.S. Cl.
USPC .......................................... 348/273; 348/280
(58) Field of Classification Search
None
See application file for complete search history.

(56) References Cited

U.S. PATENT DOCUMENTS

| | | | |
|---|---|---|---|
| 5,982,984 A * | 11/1999 | Inuiya | 386/225 |
| 2003/0197793 A1* | 10/2003 | Mitsunaga et al. | 348/222.1 |
| 2006/0175536 A1* | 8/2006 | Kim et al. | 250/208.1 |
| 2006/0198620 A1* | 9/2006 | Watanabe | 396/17 |
| 2009/0251556 A1* | 10/2009 | Mabuchi | 348/222.1 |
| 2011/0019041 A1* | 1/2011 | Ishiwata et al. | 348/280 |
| 2011/0149127 A1* | 6/2011 | Saito | 348/280 |

FOREIGN PATENT DOCUMENTS

| | | |
|---|---|---|
| JP | 2006-054276 | 2/2006 |
| JP | 2006-157953 | 6/2006 |
| JP | 2008-099073 | 4/2008 |

* cited by examiner

*Primary Examiner* — Twyler Haskins
*Assistant Examiner* — Wesley J Chiu
(74) *Attorney, Agent, or Firm* — Sheridan Ross P.C.

(57) ABSTRACT

An imaging device includes: first green pixels; and second green pixels adjacent to the respective first green pixels in a first direction, which is the direction in which electric charge accumulated in the pixels is read, wherein the dimension of the first and second green pixels in a second direction perpendicular to the first direction is twice the dimension of the first and second green pixels in the first direction.

10 Claims, 10 Drawing Sheets

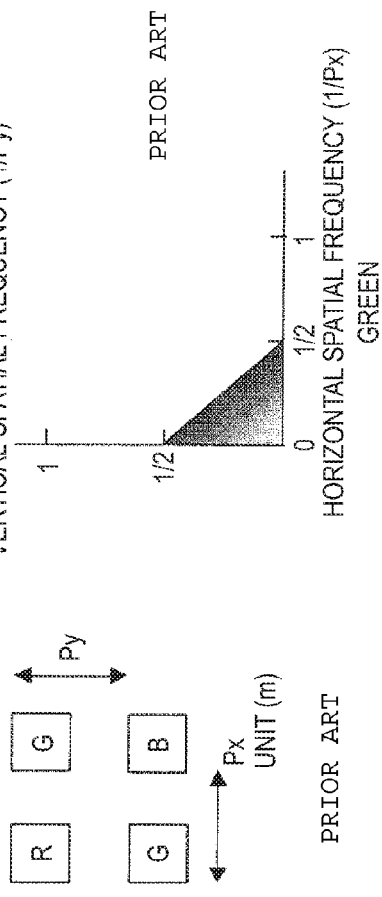
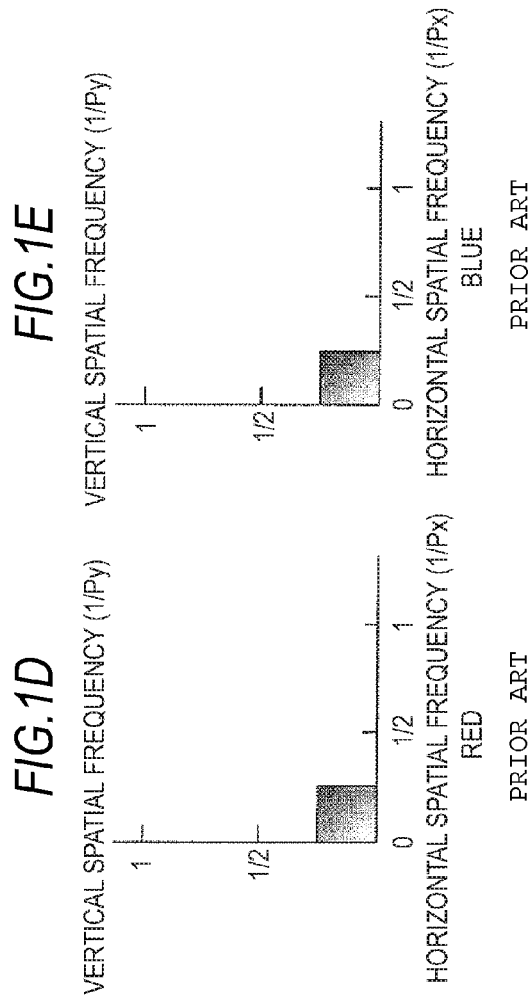
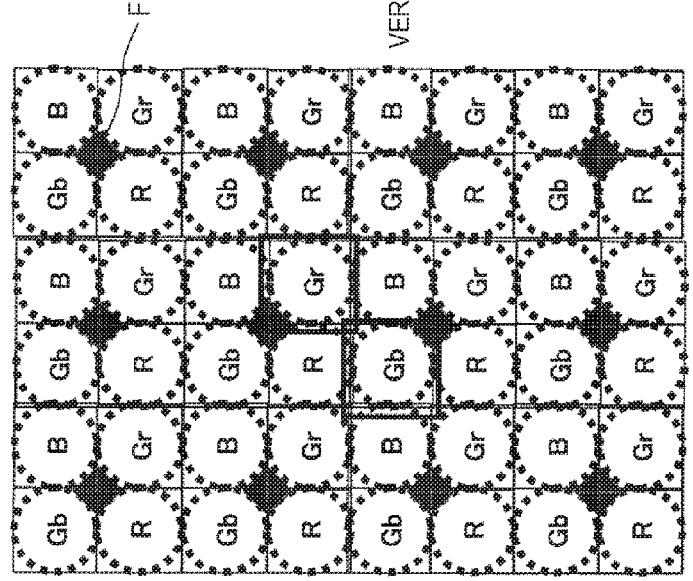

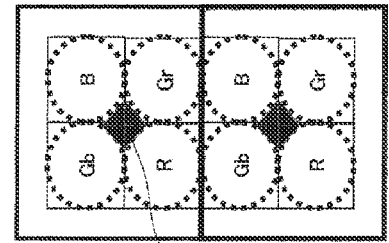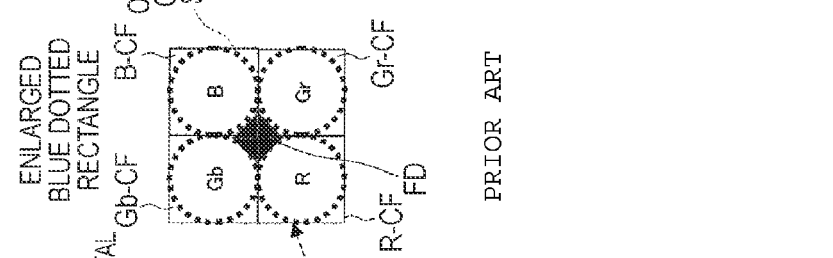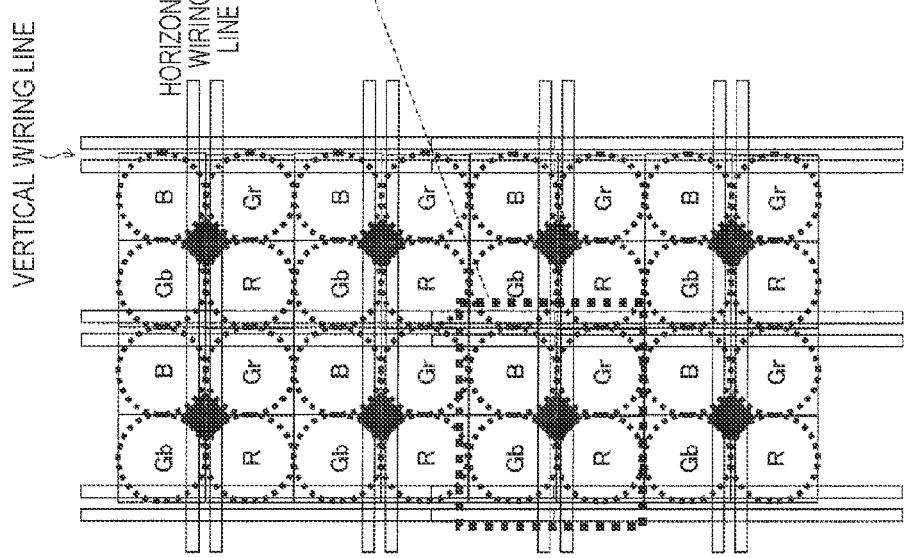

IMAGING DEVICE, ELECTRIC CHARGE READOUT METHOD, AND IMAGING APPARATUS

BACKGROUND OF THE INVENTION

1. Field of the Invention

The present invention relates to an imaging device, such as a CMOS image sensor (CIS). The invention particularly relates to an imaging device capable of improving desired pixel characteristics, for example, the sensitivity and the amount of accumulated electric charge (Qs), even when the imaging device is formed of a large number of miniaturized pixels.

2. Description of the Related Art

The invention further relates to a method and an apparatus for reading electric charge from the imaging device.

The invention further relates to a method and an apparatus for performing demosaicing on the imaging device.

The invention further relates to an imaging apparatus including the imaging device described above.

In recent CMOS image sensors and other similar imaging devices, a larger number of pixels are formed in a predetermined region to achieve higher definition images, and miniaturization is underway to this end.

When the size of each pixel in an imaging device is miniaturized to, for example, 2 μm or smaller, it has been becoming difficult to provide desired pixel characteristics. In particular, the sensitivity and the amount of accumulated electric charge (Qs) are greatly subject to a physical (spatial) constraint of reduction in pixel size, that is, the above two characteristics and the pixel size are tradeoffs. That is, since reduction in size of a pixel reduces the amount of light incident on the pixel and accumulated in a short period, the sensitivity and Qs decrease. In particular, the sensitivity is more significantly affected. The reason for this will be described later.

To prevent the decrease in Qs and sensitivity due to the reduction in pixel size, the structure of an imaging device and a light collection structure have been optimized (see JP-A-2006-157953 and WO 2006/039486A2, for example).

However, recent miniaturization and other technologies have made it possible to reduce the pixel size to the extent that it approaches the level of the wavelength of light, and the resultant decrease in the amount of light itself incident on (traveling into) a pixel causes improvement in sensitivity characteristics using the existing methods to approach a limit.

An existing light collection structure for improving the efficiency of collecting light into a photodiode, for example, an on-chip lens (OCL), increases the opening area of a pixel to a largest possible value in order to maximize the amount of light incident on (traveling into) the pixel (see JP-A-2008-99073 and JP-A-2006-54276, for example).

That is, the methods described in JP-A-2008-99073 and JP-A-2006-54276 achieve reduction in the area in a pixel that is occupied by wiring lines and sharing between pixels having the same pixel size, that is, reduction in the number of in-pixel wiring lines for reading data and the number of transistors to be used.

Further, to maximize the amount of light itself incident on a photodiode, a structure that allows an inoperative area between OCLs to be reduced in size has been attempted.

An example of related art will be described in detail with reference to the accompanying drawings.

FIG. 1A schematically shows how RGB (red, green, and blue) pixels are arranged in a Bayer layout of related art.

In the arrangement based on a Bayer layout, an RG row in which a red R pixel and a green Gr pixel are alternately disposed and a GB row in which a green Gb pixel and a blue B pixel are alternately disposed are disposed next to each other.

The pixel configuration in FIG. 1A shows that there is no correlation between the Gr and Gb pixels in the horizontal direction.

FIG. 1B shows the arrangement of four adjacent pixels among the RGB pixels in the Bayer layout illustrated in FIG. 1A.

FIGS. 1C to 1E illustrate spatial frequency characteristics of the green, red, and blue components, respectively. It is shown that the spatial frequency characteristics of the red and blue components are inferior to that of the green component.

FIGS. 2A and 2B show the pixel configuration in FIG. 1A in a more practical form.

FIG. 2A is a partial plan view, and FIG. 2B is an enlarged view showing part of FIG. 2A.

Each open dotted-line circle represents an on-chip lens (OCL) or a light collection structure.

The rectangles that surround the R, B, Gr, and Gb pixels represent RGB color filters (CFs) in the arrangement based on the Bayer scheme.

The CFs and the OCLs or light collection structures are formed on the pixels.

A floating diffusion (FD) section indicated by a rectangle divided into four is disposed at the center of a set of B, R, Gr, and Gb pixels. That is, the number of in-pixel wiring lines is reduced by an inter-pixel sharing method using vertical and horizontal wiring lines for connecting adjacent pixels, for example, a sharing method using FD (floating diffusion) sections.

As described above, the sharing method is an inter-pixel sharing method in which an FD section is shared.

FIG. 2C shows how to use four adjacent pixels to achieve inter-pixel sharing.

SUMMARY OF THE INVENTION

Recent miniaturization and other technologies have made it possible to reduce the pixel size to the extent that it approaches the level of the wavelength of light, and the resultant decrease in the amount of light itself incident on (traveling into) a pixel causes improvement in sensitivity characteristics using the existing methods to approach a limit.

In particular, when the miniaturization advances and the pixel size approaches the level of the wavelength of light, for example, visible light, the ability to collect light decreases even when an OCL or a light collection structure is used.

Further, the size of a light spot focused on a PD light receiving surface by an OCL or a light collection structure becomes larger than the area of the photodiode in a pixel. In this case, the photodiode is incapable of receiving the entire focused light, resulting in decrease in sensitivity.

In view of the circumstances described above, it is desirable to provide an imaging device that does not suffer from degradation in pixel characteristics, for example, the sensitivity and Qs, but can improve the pixel characteristics even when a large number of miniaturized pixels are formed.

It is also desirable to provide a method and an apparatus capable of efficiently operating the imaging device.

The present inventor has conducted extensive study in view of the needs mentioned above and attained to the following concepts.

(1) In sharing between pixels having the same pixel size, an on-chip lens (OCL) or a light collection structure is reviewed to reduce the size of the light spot on the light receiving surface of the photodiode (PD) and allow the entire light spot to be received by the photodiode.

(2) To reduce the size of the light spot on the PD light receiving surface, it is first necessary to enhance the light collection ability of the OCL or light collection structure. To this end, an OCL or a light collection structure having an opening larger than the pixel size is formed on the PD light receiving surface to maximize the light collection ability.

(3) Further, the overall structure is designed in such a way that even when the size of the light spot on the PD light receiving surface increases, the entire light spot can be received. To this end, pixels having the same OCL or light collection structure are connected to each other in an inter-pixel sharing method to increase the effective area of the photodiode (the area of the PD light receiving surface) and reduce or prevent light loss even in miniaturized pixels. As a result, the sensitivity is expected to be improved.

The present invention is based on the technical spirit and concepts described above.

According to an embodiment of the invention, there is provided an imaging device including first green pixels and second green pixels adjacent to the respective first green pixels in a first direction, which is the direction in which electric charge accumulated in the pixels is read. The dimension of the first and second green pixels in a second direction perpendicular to the first direction is twice the dimension of the first and second green pixels in the first direction.

It is preferable that the imaging device according to the embodiment of the invention includes a plurality of red, blue, and green pixels configured in the following manner: Each of the first green pixels and the corresponding one of the second green pixels are disposed adjacent to each other in the first direction. A first red pixel and a first blue pixel are disposed on one side of the adjacent first and second green pixels in the second direction perpendicular to the first direction, the adjacent first/second green pixels and the first red/blue pixels sandwiching a first electric charge extracting section for extracting electric charge from in-pixel electric charge accumulation means. A second red pixel and a second blue pixel are disposed on the other side of the adjacent first and second green pixels in the second direction perpendicular to the first direction, the adjacent first/second green pixels and the second red/blue pixels sandwiching a second electric charge extracting section for extracting electric charge from in-pixel electric charge accumulation means. The dimension of the adjacent first and second green pixels in the second direction is at least twice the dimension thereof in the first direction.

It is preferable that a green color filter sized to be shared by each pair of the adjacent first and second green pixels is formed.

It is preferable that the dimension of the first red pixel and the first blue pixel and the dimension of the second red pixel and the second blue pixel in the second direction are twice the dimension thereof in the first direction.

It is preferable that wiring lines for extracting electric charge from the electric charge accumulation means are formed in the first and second directions in the imaging device in such a way that the wiring lines detour around the first and second green pixels.

In particular, a first wiring line is formed between a first pair of the adjacent first and second green pixels and a second pair of the first and second green pixels adjacent in the first direction to the first pair of the adjacent first and second green pixels; and a second wiring line is formed between the adjacent first/second green pixels and the first red/blue pixels adjacent thereto on one side thereof in the second direction and between the adjacent first/second green pixels and the second red/blue pixels adjacent thereto on the other side thereof in the second direction.

Also, in the imaging device according to the embodiment of the invention, two first green pixels are disposed adjacent to each other in the first direction, and a red pixel and a first green pixel are disposed adjacent to the two first green pixels in the second direction perpendicular to the first direction; and two second green pixels are disposed adjacent to each other in the first direction in such a way that the two second green pixels are adjacent to the two first green pixels on the side opposite the red pixel and the first green pixel, and a blue pixel and a second green pixel are disposed adjacent to the two second green pixels in the second direction.

According to another embodiment of the invention, there is provided an imaging device including a first pair of first and second green pixels disposed adjacent to each other in a first direction, which is the direction in which electric charge is read, a second pair of first and second green pixels disposed adjacent to each other in such a way that the second pair of first and second green pixels is adjacent to the first pair of first and second green pixels, a third pair of adjacent first and second green pixels disposed adjacent to the first and second pairs of first and second green pixels in a second direction perpendicular to the first direction and in a position corresponding to the position between the first pair of first and second green pixels and the second pair of first and second green pixels, pairs of red and blue pixels, the red and blue pixels of each of the pairs adjacent to each other in the second direction, disposed on both sides, in the first direction, of the third pair of adjacent first and second green pixels, a first wiring line formed in the first direction between the first pair of first and second green pixels and the third pair of first and second green pixels adjacent to each other in the second direction, and a second wiring line formed in the second direction on both sides of the adjacent first and second green pixels.

According to still another embodiment of the invention, there are provided a method and an apparatus for reading electric charge from any of the imaging devices described above, the method and the apparatus processing electric charge accumulated in the electric charge accumulation means in the imaging device in the second direction perpendicular to the direction in which electric charge is read in the following manner: electric charge is accumulated in the electric charge accumulation means in an odd field during the first half of a readout period, and the electric charge accumulated in the electric charge accumulation means in the odd field is read during the remaining second half of the period. Electric charge accumulated in the electric charge accumulation means in an even field is read during the first half of the readout period, and electric charge is accumulated in the electric charge accumulation means in the even field during the remaining second half of the period.

According to another embodiment of the invention, there is provided a method and an apparatus for performing demosaicing by using electric charge produced in the pixels arranged around each pair of the first and second green pixels in any of the imaging devices described above.

According to yet another embodiment of the invention, there is provided an imaging apparatus including any of the imaging devices described above.

According to the embodiments of the invention, there is provided the imaging device that does not suffer from degradation in pixel characteristics but can improve the pixel characteristics even when a large number of miniaturized pixels are formed.

According to the embodiments of the invention, there is provided the method and the apparatus capable of efficiently operating the imaging device.

BRIEF DESCRIPTION OF THE DRAWINGS

FIG. 1A schematically shows how RGB (red, green, and blue) pixels are arranged in a Bayer layout of related art, FIG. 1B shows the arrangement of four adjacent pixels among the RGB pixels in the Bayer layout illustrated in FIG. 1A, and FIGS. 1C to 1E illustrate spatial frequency characteristics of the green, red, and blue components, respectively;

FIGS. 2A to 2C show the pixel configuration in FIG. 1A in a more practical form, FIG. 2A being a partial plan view and FIG. 2B being an enlarged view showing part of FIG. 2A, and FIG. 2C shows how to use four adjacent pixels to achieve inter-pixel sharing;

DESCRIPTION OF THE PREFERRED EMBODIMENTS

Figure 3:
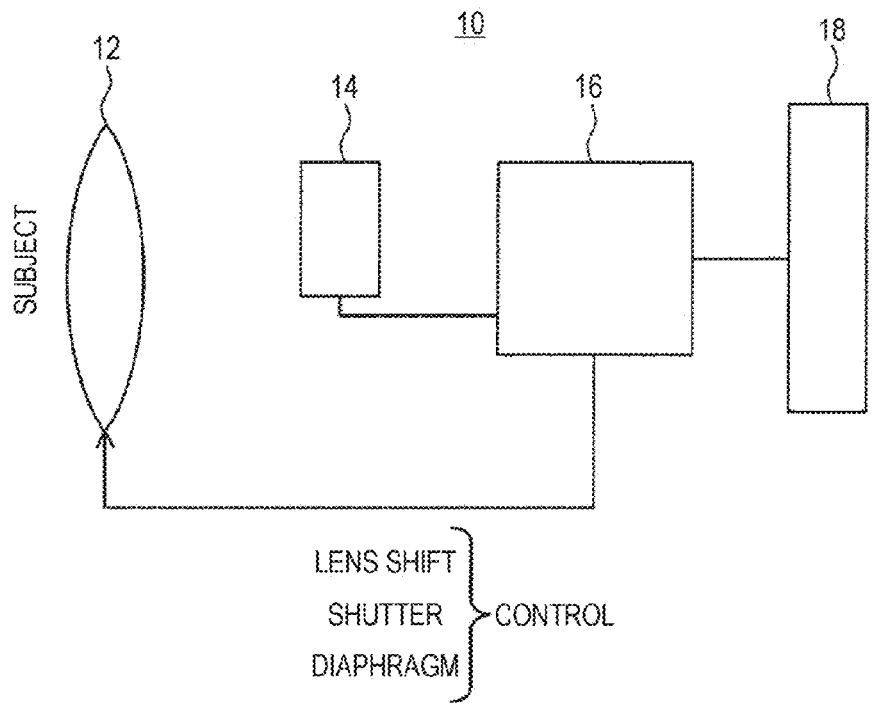
FIG. 3 is a schematic configuration diagram of an exemplary imaging apparatus in which a solid-state imaging device according to an embodiment of the invention is incorporated.

Solid-state imaging devices according to embodiments of the invention and imaging apparatuses using the solid-state imaging devices will be described below.

The description will be made in the following order.
1. Configuration of imaging apparatus
2. First embodiment
3. Second embodiment
4. Third embodiment
5. Fourth embodiment
6. Fifth embodiment
7. Signal processing method

Configuration of Imaging Apparatus

[Imaging Apparatus]

An embodiment of an exemplary imaging apparatus in which an imaging device according to an embodiment of the invention is incorporated will be described with reference to FIG. 3.

An imaging apparatus 10 of the present embodiment is used, for example, as a digital camera and a video camcorder.

The imaging apparatus 10 includes an imaging optical system 12 housed in a lens barrel, an imaging device 14, a signal processor 16, and an image display 18, such as a liquid crystal display.

The imaging optical system 12 is formed of a plurality of lenses, a drive system including motors that move the lenses, a shutter, and other components, and zooming and other operations are carried out under the control of the signal processor 16. The imaging optical system 12 focuses an image of a subject on the imaging device 14.

The imaging device 14 corresponds to one of the various imaging devices of the following embodiments and changes the light representing an image having passed through the imaging optical system 12 into an electric signal in a photoelectric conversion process. Specifically, the imaging device 14 accumulates electric charge corresponding to the light incident on a photodiode (PD) provided in correspondence with each pixel.

The signal processor 16, which will be described later in detail, controls the PD corresponding to each pixel to accumulate electric charge and extracts the electric charge accumulated in the PD. The signal processor 16 further stores the electric charge extracted from the imaging device 14 as an imaged signal, performs signal processing on the imaged signal, outputs the processed signal to the image display 18, and displays the output signal as an image of the subject captured through the imaging optical system 12.

The PD corresponds to electric charge accumulation means according to an embodiment of the invention.

[Cross-Sectional Structure of Imaging Device]

As the imaging device according to an embodiment of the invention used as the imaging device 14 in the imaging apparatus 10, a CMOS image sensor (CIS) is presented as an example and an embodiment thereof is described below.

Figure 4:
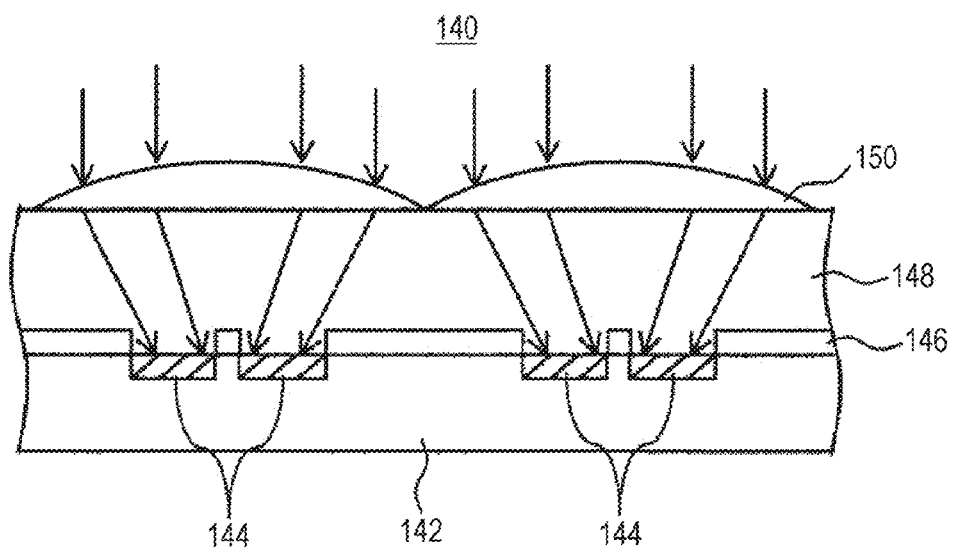
FIG. 4 is a schematic cross-sectional view of a CMOS image sensor as an exemplary imaging device according to an embodiment of the invention.

A cross-sectional structure of a CIS 140 is described with reference to FIG. 4.

The CIS 140 includes photodiode (PD) light receivers 144 formed on a semiconductor substrate 142, a light blocking film 146, a color filter (CF) and planarization film 148, and on-chip lenses (OCL) 150.

The converging light having passed through the imaging optical system 12 is focused by the OCLs 150, passes through the CF and planarization film 148, and enters the PD light receivers 144, which accumulate electric charge corresponding to the amount of incident light.

A variety of embodiments of the imaging device 14 will be described below.

First Embodiment

Configuration of Solid-State Imaging Device

Figure 5:
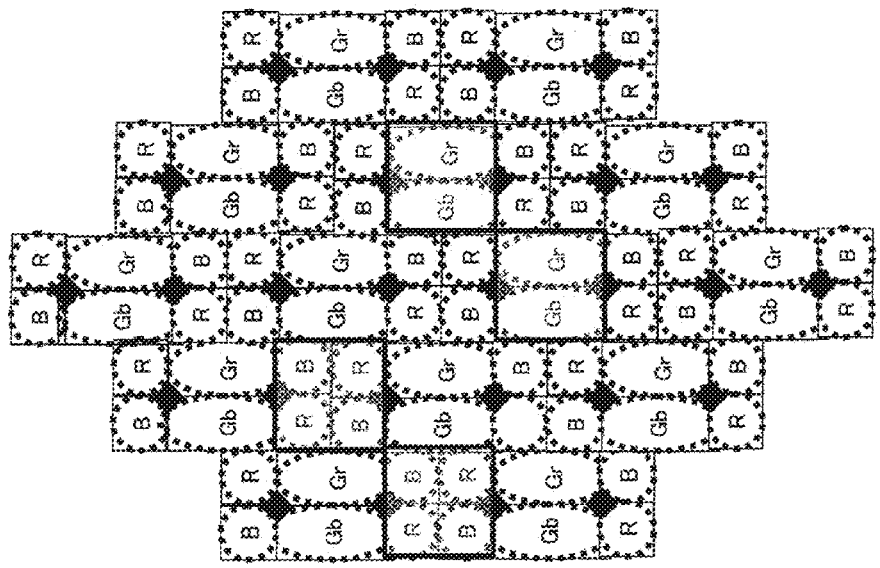
FIG. 5A schematically shows an imaging device according to a first embodiment of the invention.
FIG. 5B shows the spatial frequency for green pixels (Gr and Gb)
FIG. 5C shows the spatial frequency for red and blue pixels.

FIG. 5A schematically shows an imaging device 14A according to a first embodiment of the invention.

Figure 6:
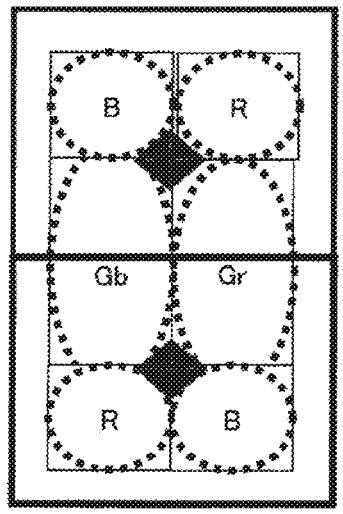
FIG. 6 is an enlarged view illustrating part of the pixels illustrated in FIG. 5A.

FIG. 6 is an enlarged view illustrating part of the pixels illustrated in FIG. 5A.

In FIGS. 5A and 6, the number of in-pixel wiring lines is reduced by an inter-pixel sharing method using vertical and horizontal wiring lines for connecting adjacent pixels, for example, a sharing method using FD (floating diffusion) sections. That is, a floating diffusion (FD) section indicated by a rectangle divided into four is disposed at the center of each set of B, R, Gr, and Gb pixels. The sharing method is an inter-pixel sharing method in which an FD is shared.

Each open dotted-line circle represents an on-chip lens (OCL) or a light collection structure.

The rectangles that surround the R, B, Gr, and Gb pixels represent RGB color filters (CFs) in the arrangement based on the Bayer scheme.

The CFs and the OCLs or light collection structures are formed on the pixels.

Comparing the pixel arrangement illustrated in FIGS. 5A and 6 with the pixel arrangement illustrated in FIG. 2C, one can find that the pixel arrangement illustrated in FIGS. 5A and 6 is obtained by vertically inverting two rows in the pixel arrangement illustrated in FIG. 2C.

In other words, the Gr pixel (first green pixel, for example) and the Gb pixel (second green pixel, for example) adjacent to each other in the horizontal direction are configured in terms of size in such a way that the vertical size is twice the horizontal size.

As illustrated in FIGS. 5A and 6, the upper Gr pixel is adjacent to the lower Gr pixel. Like the Gr pixels, the Gb pixels are adjacent to each other by vertically inverting the lower two rows. The Gr pixels therefore correlate with the Gb pixels.

Further, in the pixel arrangement described above, the Gr pixels strongly correlate with each other because readout operation is carried out in the vertical or horizontal direction of the pixels that share a photodiode (PD). The pixel arrangement has a configuration in which using the correlation, for example, at the time of interpolation allows contour correction and other operations to be advantageously carried out.

Only the color filters (CFs) are changed in the vertically inverted configuration illustrated in FIGS. 5A and 6. That is, a single large green CF whose area is doubled is shared by a Gr pixel and a Gb pixel.

The vertically inverted configuration does not affect the photodiodes (PD) or the on-chip lenses (OCL) or light collections structures.

FIG. 5B shows the spatial frequency for the green pixels (Gr and Gb). The spatial frequency for the green pixels is the same as that described with reference to FIG. 1C.

FIG. 5C shows the spatial frequency for the red and blue pixels. The spatial frequency for the red and blue pixels is the same as the spatial frequency for the green pixels illustrated in FIG. 5B and superior to the spatial frequencies illustrated in FIGS. 1D and 1E.

Each of the CFs on adjacent Gr and Gb pixels in the vertically inverted pixel structure illustrated in FIGS. 5A and 6 has a size corresponding to two pixels.

Providing a single OCL or light collection structure (the following description will be made only of an OCL) on a green CF corresponding to two pixels allows the light collection ability of the OCL to be improved.

For example, as compared with an OCL on a pixel whose size is 2 µm (vertical) by 2 µm (horizontal), an OCL whose size is 4 µm (vertical) by 2 µm (horizontal) can be formed in the present embodiment, resulting in increase in the amount of collected light and improvement in sensitivity and Qs.

FIGS. 5A and 6 illustrate a structure in which the photodiodes (PDs) positioned below the shared CFs having the same color are also shared. As a result, the effective PD area is doubled, whereby the amount of light incident on the PDs and hence the sensitivity is doubled.

As illustrated in FIGS. 5A and 6, the electric charge accumulated in the photodiodes (PDs) below the color filters (CFs) having the same color can be read via the floating diffusion (FD) sections positioned above and below the PDs, each of the FD sections segmented into four.

The electric charge is read, for example, by the signal processor 16 illustrated in FIG. 3. The readout operation will be described later in detail.

The features of the solid-state imaging device according to the first embodiment having been described with reference to FIGS. 5A to 5C and 6 are summarized as follows:

(1) Providing a color filter (CF) corresponding to two pixels allows the OCL on the green pixel CF, for example, to have an enlarged size corresponding to the two pixels. As a result, the light collection ability of the OCL is improved.

(2) Sharing the PDs positioned below CFs having the same color between the corresponding upper and lower pixels in the pixel arrangement illustrated in FIGS. 5A and 6 allows the effective PD area and hence the sensitivity to be doubled.

(3) Further, reading the electric charge accumulated in the PDs via the upper and lower floating diffusion (FD) sections in the pixel arrangement illustrated in FIGS. 5A and 6 allows Qs to be also doubled.

(4) If the OCL formed by using the method described in (1) does not have sufficient light collection ability, the light spot on the PD light receiving surface increases in size. However, since the structure described above allows the light receiving area of the PDs to be doubled, the decrease in light collection ability can be compensated.

In the first embodiment, adjacent Gr and Gb pixels are doubled in size in the vertical direction. However, since miniaturization makes each single pixel of the imaging device according to the present embodiment fairly small, there is no substantial decrease in resolution resulting from the double-size green pixels but the advantageous effect described above exceeds.

Further, the signal processor 16 can substantially compensate any decrease in resolution by using data on surrounding pixels.

Second Embodiment

Configuration of Solid-State Imaging Device

An imaging device according to a second embodiment of the invention will be described with reference to FIG. 7.

Figure 7:
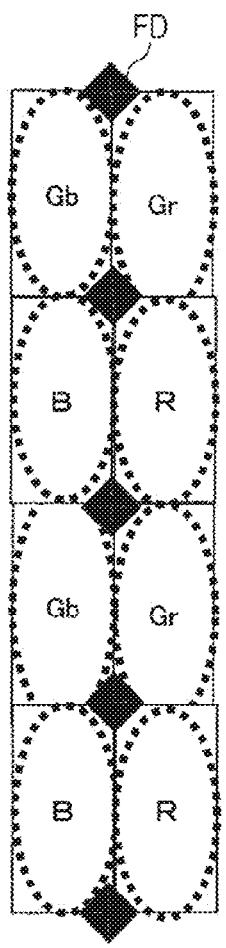
FIG. 7 illustrates an imaging device according to a second embodiment of the invention.

In FIG. 7, not only are the Gr and Gb pixels configured in the same manner as in the first embodiment but also the B and R pixels are doubled in size in the vertical direction like the G pixels.

As a result, in the imaging device according to the second embodiment, the above advantageous effect provided by the configuration in the first embodiment is also applied to the B and R pixels. That is, all the pixels can provide the same advantageous effect as that provided in the first embodiment.

In the second embodiment, all the pixels are doubled in size in the vertical direction. However, since miniaturization makes each single pixel of the imaging device according to the present embodiment fairly small, there is no substantial decrease in resolution resulting from the double-size pixels but the advantageous effect described above exceeds.

Further, the signal processor 16 can substantially compensate any decrease in resolution by using data on surrounding pixels.

Third Embodiment

Configuration of Solid-State Imaging Device

An imaging device according to a third embodiment of the invention will be described with reference to FIGS. 8A and 8B.

Figure 8B:
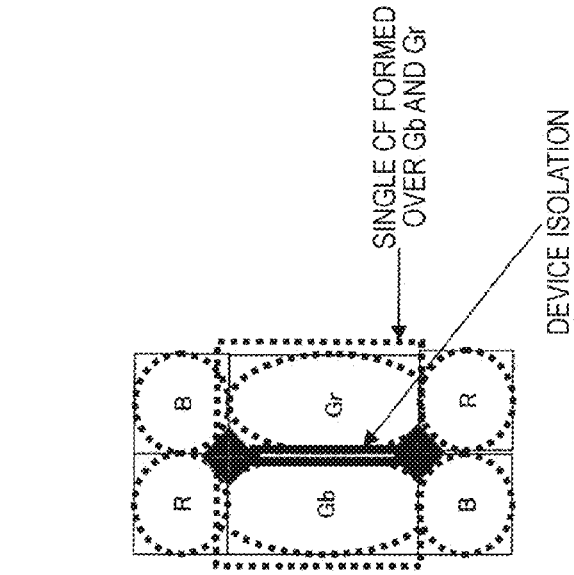
FIGS. 8A and 8B illustrate an imaging device according to a third embodiment of the invention.
Figure 8A:
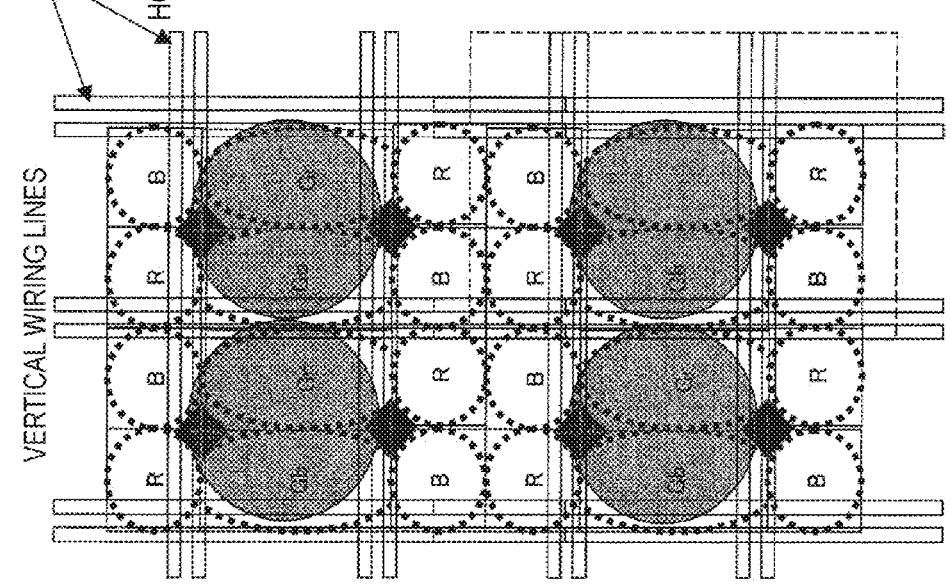

FIG. 8A shows the arrangement of a plurality of pixels, and FIG. 8B is an enlarged view of part of the arrangement.

Gr and Gb pixels adjacent to each other in the horizontal direction with a device isolation portion therebetween can be formed by using a single large color filter (CF).

The third embodiment takes advantage of the flexibility in wiring, which is an advantage of a pixel sharing method and allows use of a structure in which no wiring line passes above the G (Gr and Gb) pixels.

FIG. 8A illustrates how the wiring lines extend in the vertical and horizontal directions. In this case, since the wiring lines do not block the openings of the Gr and Gb pixels, the area of the opening of each of the Gr and Gb pixels can be maximized.

Another advantage of the pixel structure illustrated in FIGS. 8A and 8B lies in the layout of four green pixels (two pairs of Gr pixel and Gb pixel) arranged in the horizontal direction, and the layout allows the filters (CFs) having the same color to be connected to each other and enlarged by four times. As a result, the OCL on the connected green CF can be sized to cover four pixels. The enlarged OCL can make full use of its light collection ability. As a result, the light spot on the PD light receiving surface further decreases in size, whereby the OCL light collection structure can collect the light and concentrate the entire light onto the PD light receiving surface so that no light loss occurs.

Therefore, the imaging device according to the third embodiment has further improved sensitivity and Qs.

Fourth Embodiment

Configuration of Solid-State Imaging Device

An imaging device according to a fourth embodiment of the invention will be described with reference to FIG. 9.

Figure 9:
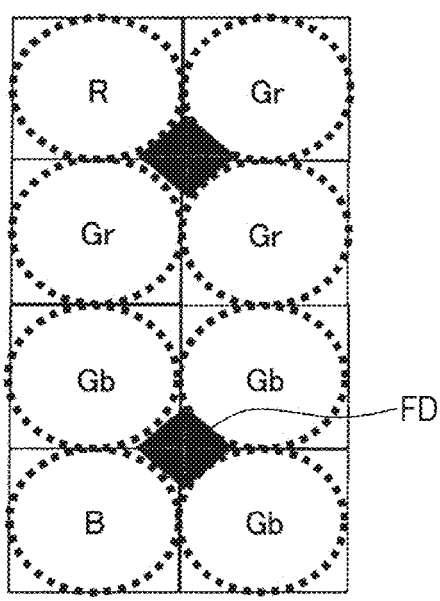
FIG. 9 illustrates an imaging device according to a fourth embodiment of the invention.

FIG. 9 shows an embodiment of an imaging device configured to have upper and lower pixels in the vertical direction inverted based on the Bayer layout illustrated in FIGS. 1A and 2A, like the illustration in FIGS. 5A and 6.

The fourth embodiment has a configuration in which six green pixels, three Gr pixels and three Gb pixels, per R pixel and B pixel are disposed.

The sensitivity can be improved by setting the number of Gr and Gb pixels to be greater than that in the Bayer layout illustrated in FIG. 1A, as described above.

Fifth Embodiment

Configuration of Solid-State Imaging Device

An imaging device according to a fifth embodiment of the invention will be described with reference to FIG. 10.

Figure 10:
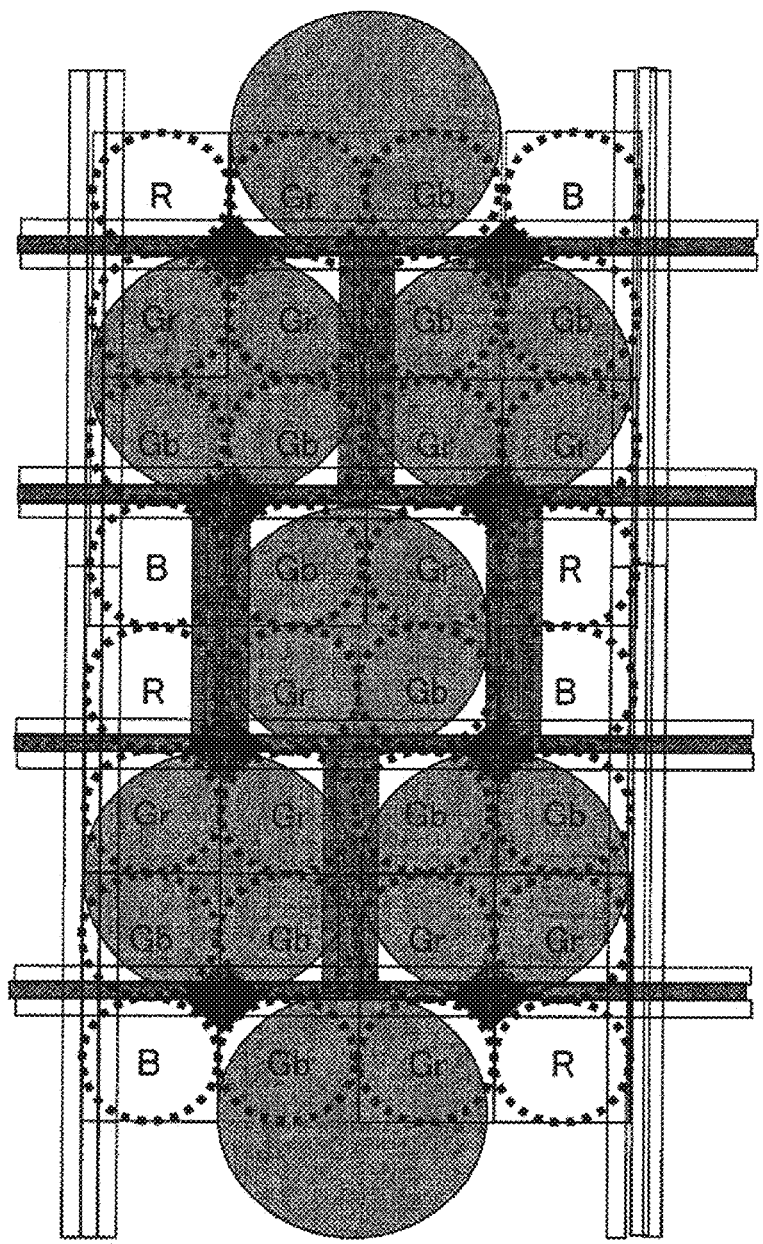
FIG. 10 illustrates an imaging device according to a fifth embodiment of the invention.

FIG. 10 illustrates the configuration of an imaging device according to an embodiment in which the structure illustrated in FIG. 9 described as the fourth embodiment is employed but wiring lines do not pass above the Gr and Gb pixels as illustrated in FIG. 8A described as the second embodiment.

An advantageous effect provided in the fifth embodiment is basically the same as that provided in the third embodiment illustrated in FIGS. 8A and 8B.

That is, color filters (CFs) having the same color can be connected to each other and enlarged by four times. As a result, the OCL on the connected CF can be sized to cover four pixels. Since the enlarged OCL can make full use of its light collection ability, the light spot on the PD light receiving surface further decreases in size, whereby the OCL can collect the light and concentrate the entire light onto the PD light receiving surface so that no light loss occurs. As a result, the sensitivity and Qs are improved.

Signal Processing Method

[Data Readout Method]

A description will be made of a data readout method used in an imaging device in any of the embodiments of the invention in which upper and lower pixels are inverted.

Figure 11A:
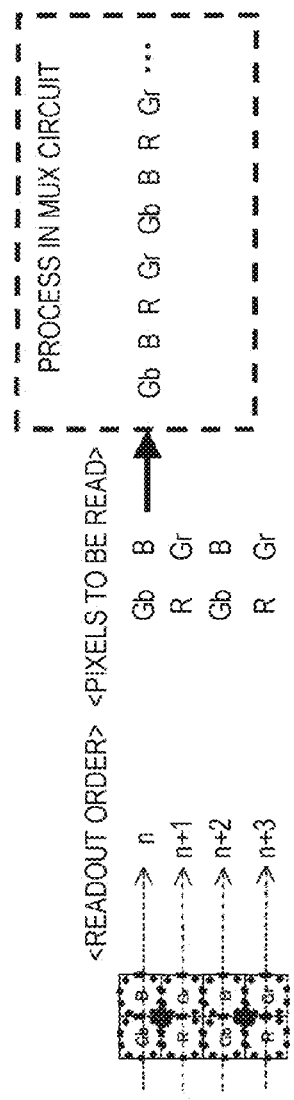
FIG. 11A shows a data readout method used in a solid-state imaging device having a Bayer layout.

FIG. 11A shows a data readout method used in a solid-state imaging device based on a Bayer layout. The data readout method illustrated in FIG. 11A employs the same method as in a non-interlaced scheme, in which pixel data are sequentially read in column order.

When pixel data are read in column order, the data readout order can be controlled by a multiplexer.

The data readout method according to an embodiment of the invention will be described with reference to FIG. 11B.

Since each pair of Gr and Gb pixels share a floating diffusion (FD) section, electric charge accumulated in a photodiode shared by upper and lower pixels may not be read by using an existing non-interlaced scheme.

Figure 11B:
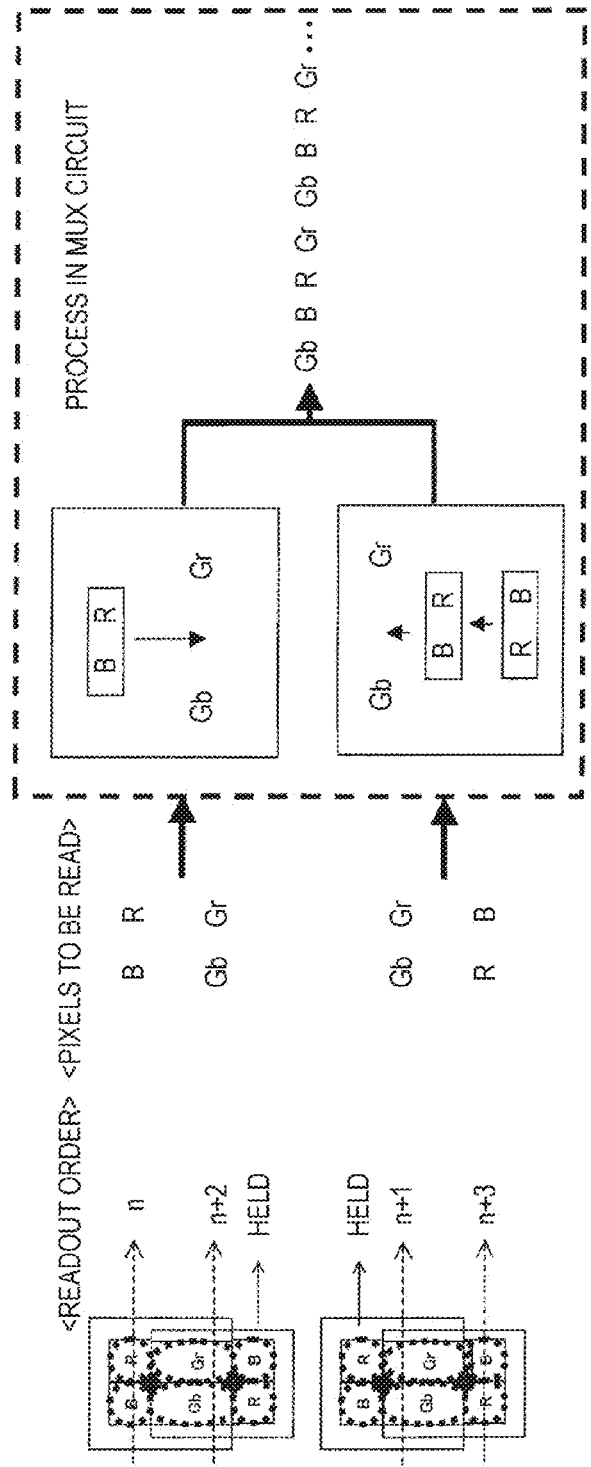
FIG. 11B illustrates a data readout method according to an embodiment of the invention.

In the embodiment of the invention, for example, the process carried out by a multiplexer (MUX) provided in the signal processor 16 in the imaging device 10 illustrated in FIG. 3 differs from the process carried out in an existing non-interlaced scheme in FIG. 11A, as shown in FIG. 11B.

That is, in the present embodiment, the process carried out in an interlaced scheme is used to read electric charge accumulated in a photodiode shared by upper and lower pixels.

The final data output is produced by using the existing method illustrated in FIG. 11A.

An electric charge readout method carried out in the signal processor 16 in the imaging device 10 by using an interlaced scheme according to the present embodiment will be described with reference to FIG. 11B.

(1) First, electric charge in the pixels corresponding to an even field, for example, disposed in n and (n+2) columns is read.

(2) Then, electric charge accumulated in pixels corresponding to an odd field, for example, disposed in (n+1) and (n+3) columns is read.

The readout operations described above are repeated.

It is noted that the readout operations described above can be reversed.

The above description will be specifically made with reference to a case where the frame rate is, for example, 15 fps (frames/second). Electric charge in the pixels corresponding to an even field, for example, disposed in n and (n+2) columns is read in the first half of one frame, i.e., 1/30 sec., and electric charge accumulated in the pixels corresponding to an odd field, for example, disposed in (n+1) and (n+3) columns is read in the second half of the one frame, i.e., 1/30 sec.

In the method described above for reading electric charge accumulated in a photodiode by using the signal processor 16, after the electric charge in the pixels in the (n+2) column in an even field is read, electric charge can be accumulated in the emptied photodiode in the second half of the one frame. The electric charge accumulated in the photodiode during this period is read in the first half of the following one frame.

It is noted that the readout operations described above can be reversed.

Information on a single image (one frame) is formed by combining the image represented by the electric charge data from the pixels corresponding to the even field described above with the image represented by the electric charge data from the pixels corresponding to the odd field described above.

The thus formed single image data are, for example, stored in a frame memory in the signal processor 16 in the imaging device 10 and displayed on the image display 18 as an image captured by the imaging device 10.

[Demosaicing Method]

A demosaicing method will next be described.

A variety of demosaicing methods are known in the art. In a basic method among them, information on surrounding pixels is used to produce blue and red signals expected to be contained in a Gr pixel.

Figure 12B:
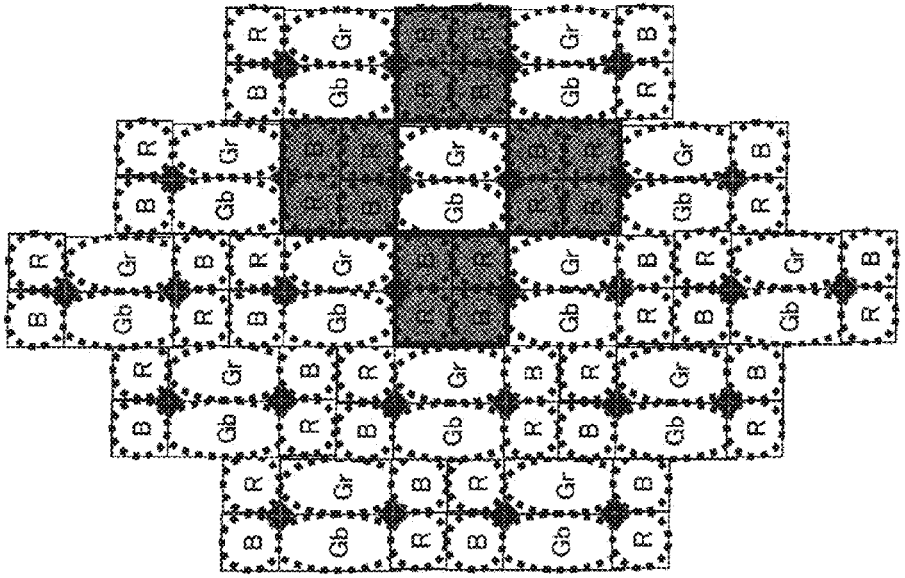
FIG. 12B illustrates a demosaicing method according to an embodiment of the invention.
Figure 12A:
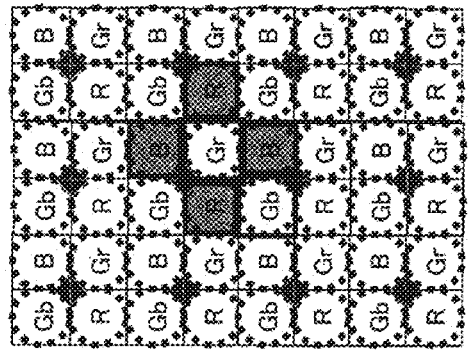
FIG. 12A illustrates an existing demosaicing method.

FIG. 12A illustrates an existing demosaicing method, and FIG. 12B illustrates a demosaicing method according to an embodiment of the invention.

As illustrated in FIG. 12A, when 3 by 3 pixels are processed, for example, the central Gr pixel produces R and B contained in the Gr pixel by using the surrounding Gb, B, and R pixels.

FIG. 12B illustrates how the process described above is carried out, which can basically be the same process illustrated in FIG. 12A. The process illustrated in FIG. 12B is carried out, for example, in the signal processor 16 in the imaging device 10 illustrated in FIG. 3.

Compared with the information obtained by the process illustrated in FIG. 12A, the process according to the present embodiment illustrated in FIG. 12B can provide relatively more satisfactory information than the characteristics of adjacent upper and lower pixels expected to have the same signal level.

In FIG. 12B, the Gr and Gb pixels surrounded by the black line have the same information in some cases and do not have the same information in other cases. In the present embodiment, contour correction is readily carried out based on the signal levels of these Gr and Gb pixels. That is, since the Gr and Gb pixels have stronger correlation in the process according to the present embodiment illustrated in FIG. 12B than in the process illustrated in FIG. 12A as described above, demosaicing can also be relatively readily carried out.

The imaging devices according to the embodiments described above have the following features and advantageous effects:

(1) Using a single color filter (CF) over pixels having the same color allows the area of the CF to be twice the area of each of the pixels. As compared with an existing solid-state imaging device, the light collection ability of an OCL or a light collection structure formed on the CF can be improved by the increased area of the OCL or the light collection structure by a factor of two rather than the OCL or the light collection structure itself formed on the CF.

(2) In the configuration described above, connecting the photodiode (PD) in an upper pixel to the photodiode (PD) in a lower pixel allows the effective area of the PD to be doubled. Doubling the area of the PD allows the light spot (the amount of incident light) received by the PD light receiving surface to be increased even when the light collection ability of the OCL or the light collection structure on the CF is insufficient.

(3) A data readout method or demosaicing, when skillfully designed, can be performed in the same manner as in RGB (red, green, and blue) pixels in a Bayer layout. Further, signal processing can be relatively readily carried out by using connected photodiodes in the vertical direction and the correlation thereof.

(4) In an inter-pixel sharing method, the OCL or light collection structure can be enlarged by four times the pixel size by skillfully routing wiring lines. As a result, the light collection efficiency of the OCL or light collection structure can be maximized.

(5) Although the electric charge readout method uses an interlaced scheme, the result is the same as that in a non-interlaced scheme. That is, the order of the electric charge having been read is the same as that in related art, and it is therefore not necessary to change, for example, the signal processing performed in the signal processor 16 even when the imaging device according to any of the embodiments described above is used.

As described above, incorporating the imaging device 14 described above in the imaging apparatus 10 allows an image with satisfactory sensitivity and Qs to be provided.

The sensitivity and Qs of a solid-state imaging device have been successfully improved by achieving the concepts described above, that is:

(1) In sharing between pixels having the same pixel size, an on-chip lens (OCL) or a light collection structure is reviewed to reduce the size of the light spot on the light receiving surface of the photodiode (PD) and allow the entire light spot to be received by the photodiode.

(2) To reduce the size of the light spot on the PD light receiving surface, it is first necessary to enhance the light collection ability of the OCL or light collection structure. To this end, an OCL or a light collection structure having an opening larger than the pixel size is formed on the PD light receiving surface to maximize the light collection ability.

(3) Further, the overall structure is designed in such a way that even when the size of the light spot on the PD light receiving surface increases, the entire light spot can be received. To this end, pixels having the same OCL or light collection structure are connected to each other in an inter-pixel sharing method to increase the effective area of the photodiode (the area of the PD light receiving surface) and reduce or prevent light loss even in miniaturized pixels.

Embodiments of the invention are not limited to those described above, but a variety of embodiments including boundaries of the embodiments described above and falling within the technical spirit set forth in the invention can be employed.

A CMOS image sensor (CIS) has been presented by way of example of the imaging device 14, but the imaging device 14 is not limited to a CIS and other variety of imaging devices similar to that described above can be used in the embodiments of the invention.

In the imaging device according to any of the embodiments of the invention, color coding for pixel summation can be performed by shifting data formed of n pixels having the same color and selected from m vertical pixels by m horizontal pixels (m>n) by a predetermined value.

In the imaging device according to any of the embodiments of the invention, selective convergence and correction can be performed in relation to an optical signal detected by a photodiode by using, for example, the signal processor 16 and the imaging optical system 12.

The present application contains subject matter related to that disclosed in Japanese Priority Patent Application JP 2009-147511 filed in the Japan Patent Office on Jun. 22, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device comprising:
   red pixels;
   blue pixels;
   first green pixels; and
   second green pixels adjacent to the respective first green pixels in a first direction, which is the direction in which electric charge accumulated in the pixels is read,
   wherein the dimension of the first and second green pixels in a second direction perpendicular to the first direction is twice the dimension of the first and second green pixels in the first direction, wherein the dimension of the red pixels in the second direction is twice the dimension of the red pixels in the first direction, wherein the dimension of the blue pixels in the second direction is twice the dimension of the blue pixels in the first direction,
   wherein the pixels are arranged in groups of four pixels, with each group of four pixels including one of the first green pixels and one of the second green pixels in a first row, and one of the red pixels and one of the blue pixels in a second row immediately below the first row, and
   wherein for each group of four pixels a floating diffusion section is located in an area centered between the four pixels,
   wherein each of the first green pixels and the corresponding one of the second green pixels are disposed adjacent to each other in the first direction,
   a first red pixel of the red pixels and a first blue pixel of the blue pixels are disposed on one side of the adjacent first and second green pixels in the second direction perpendicular to the first direction, the adjacent first/second green pixels and the first red/blue pixels sandwiching a first electric charge extracting section for extracting electric charge from a first in-pixel electric charge accumulation means, and
   a second red pixel of the red pixels and a second blue pixel of the blue pixels are disposed on the other side of the adjacent first and second green pixels in the second direction perpendicular to the first direction, the adjacent first/second green pixels and the second red/blue pixels sandwiching a second electric charge extracting section for extracting electric charge from a second in-pixel electric charge accumulation means.

2. The imaging device according to claim 1, further comprising a green color filter sized to be shared by each pair of the adjacent first and second green pixels.

3. The imaging device according to claim 2, further comprising light collection means formed in front of each of the color filters when viewed in the direction in which incident light travels.

4. The imaging device according claim 1,
   wherein wiring lines are formed in the first and second directions in such a way that the wiring lines detour around the first and second green pixels.

5. The imaging device according to claim 1,
   wherein a first wiring line is formed between a first pair of the adjacent first and second green pixels and a second pair of the adjacent first and second green pixels adjacent in the first direction to the first pair of the adjacent first and second green pixels, and
   a second wiring line is formed between the adjacent first/second green pixels and the first red/blue pixels adjacent thereto on one side thereof in the second direction and between the adjacent first/second green pixels and the second red/blue pixels adjacent thereto on the other side thereof in the second direction.

6. The imaging device according to claim 5,
   wherein two first green pixels are disposed adjacent to each other in the first direction, and a red pixel and a first green pixel are disposed adjacent to the two first green pixels in the second direction perpendicular to the first direction, and
   two second green pixels are disposed adjacent to each other in the first direction in such a way that the two second green pixels are adjacent to the two first green pixels on the side opposite the red pixel and the first green pixel, and a blue pixel and a second green pixel are disposed adjacent to the two second green pixels in the second direction.

7. An electric charge readout method for processing electric charge accumulated in a plurality of electric charge accumulation means in the imaging device of claim 1 in the second direction perpendicular to the direction in which electric charge is read, the method comprising the steps of:
   accumulating electric charge in a first electric charge accumulation means of the plurality of electric charge accumulation means in an odd field during the first half of a readout period, and reading the electric charge accumulated in the first electric charge accumulation means in the odd field during the remaining second half of the period, and
   reading electric charge accumulated in a second electric charge accumulation means of the plurality of electric charge accumulation means in an even field during the first half of the readout period, and accumulating electric charge in the second electric charge accumulation means in the even field during the remaining second half of the period.

8. An electric charge readout apparatus connected to the imaging device of claim 1 and processing electric charge accumulated a plurality of electric charge accumulation means in the imaging device in the second direction perpendicular to the direction in which electric charge is read,
   wherein electric charge is accumulated in a first electric charge accumulation means of the plurality of electric charge accumulation means in an odd field during the first half of a readout period, and the electric charge accumulated in the first electric charge accumulation means in the odd field is read during the remaining second half of the period, and
   electric charge accumulated in a second electric charge accumulation means of the plurality of electric charge accumulation means in an even field is read during the first half of the readout period, and electric charge is accumulated in the second electric charge accumulation means in the even field during the remaining second half of the period.

9. A method for performing demosaicing by using electric charge produced in the pixels arranged around each pair of the first and second green pixels in the imaging device according to claim 1.

10. An apparatus connected to the imaging device according to claim 1 and performing demosaicing by using electric charge produced in the pixels arranged around each pair of the first and second green pixels.

* * * * *